(12) United States Patent
Kawai et al.

(10) Patent No.: US 11,778,827 B2
(45) Date of Patent: *Oct. 3, 2023

(54) MEMORY DEVICES INCLUDING MULTIPLEXER DEVICES, AND RELATED ELECTRONIC SYSTEMS

(71) Applicant: Micron Technology, Inc., Boise, ID (US)

(72) Inventors: Koichi Kawai, Kanagawa (JP); Yoshihiko Kamata, Kanagawa (JP); Yoshiaki Fukuzumi, Kanagawa (JP); Tamotsu Murakoshi, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/811,037

(22) Filed: Jul. 6, 2022

(65) Prior Publication Data
US 2022/0336490 A1 Oct. 20, 2022

Related U.S. Application Data

(63) Continuation of application No. 17/006,364, filed on Aug. 28, 2020, now Pat. No. 11,393,845.

(51) Int. Cl.
*G11C 11/00* (2006.01)
*H10B 43/27* (2023.01)
(Continued)

(52) U.S. Cl.
CPC ......... *H10B 43/27* (2023.02); *G11C 16/0483* (2013.01); *G11C 16/24* (2013.01);
(Continued)

(58) Field of Classification Search
CPC ............................ G11C 16/0483; G11C 16/24
See application file for complete search history.

(56) References Cited

U.S. PATENT DOCUMENTS 5,973,961 A 10/1999 Park et al.
6,400,604 B2 6/2002 Noda
(Continued)

OTHER PUBLICATIONS

International Search Report for Application No. PCT/US2021/044742, dated Jan. 4, 2022, 6 pages.
(Continued)

*Primary Examiner* — Pho M Luu
(74) *Attorney, Agent, or Firm* — TraskBritt

(57) ABSTRACT

A microelectronic device comprises first digit lines, second digit lines, and multiplexer devices. The first digit lines are coupled to strings of memory cells. The second digit lines are coupled to additional strings of memory cells. The second digit lines are offset from the first digit lines in a first horizontal direction and are substantially aligned with the first digit lines in a second horizontal direction orthogonal to the first horizontal direction. The multiplexer devices are horizontally interposed between the first digit lines and the second digit lines in the first horizontal direction. The multiplexer devices are in electrical communication with the first digit lines, the second digit lines, and page buffer devices. Additional microelectronic devices, memory devices, and electronic systems are also described.

20 Claims, 5 Drawing Sheets

(51) Int. Cl.
*G11C 16/04* (2006.01)
*G11C 16/24* (2006.01)
*H01L 27/02* (2006.01)
*H10B 41/27* (2023.01)
*H10B 41/41* (2023.01)
*H10B 43/40* (2023.01)
*H10B 41/10* (2023.01)
*H10B 43/10* (2023.01)

(52) U.S. Cl.
CPC ...... *H01L 27/0266* (2013.01); *H01L 27/0292* (2013.01); *H01L 27/0296* (2013.01); *H10B 41/27* (2023.02); *H10B 41/41* (2023.02); *H10B 43/40* (2023.02); *H10B 41/10* (2023.02); *H10B 43/10* (2023.02)

(56) References Cited

U.S. PATENT DOCUMENTS

| | | | |
|---|---|---|---|
| 6,998,873 B2 | 2/2006 | Park | |
| 8,456,920 B2 | 6/2013 | Arizono | |
| 8,611,153 B2 | 12/2013 | Tanzawa | |
| 8,656,092 B2 | 2/2014 | Ha | |
| 8,958,228 B2 | 2/2015 | Samachisa et al. | |
| 8,971,112 B2 | 3/2015 | Crippa et al. | |
| 9,299,442 B2 | 3/2016 | Ha | |
| 9,305,660 B2 | 4/2016 | Moschiano et al. | |
| 9,343,169 B2 | 5/2016 | Vali et al. | |
| 9,672,156 B2 | 6/2017 | Ha | |
| 9,786,347 B1 | 10/2017 | Kawamura et al. | |
| 10,468,116 B2 | 11/2019 | Ha | |
| 10,510,397 B2 | 12/2019 | Yamada | |
| 11,393,845 B2 * | 7/2022 | Kawai | H01L 27/0266 |
| 11,502,091 B1 * | 11/2022 | Vimercati | G11C 11/221 |
| 2007/0195571 A1 | 8/2007 | Aritome | |
| 2009/0268537 A1 | 10/2009 | Kajigaya | |
| 2011/0013466 A1 | 1/2011 | Ishizaki | |
| 2018/0364908 A1 | 12/2018 | Lea et al. | |
| 2018/0365293 A1 | 12/2018 | De et al. | |
| 2020/0118615 A1 | 4/2020 | Yamada | |
| 2020/0234754 A1 | 7/2020 | Derner et al. | |
| 2021/0398945 A1 * | 12/2021 | Parekh | H01L 25/18 |
| 2022/0375930 A1 * | 11/2022 | Simsek-Ege | H01L 25/0657 |

OTHER PUBLICATIONS

Invitation to Pay Additional Fees for Application No. PCT/US2021/044742, dated Nov. 4, 2021, 5 pages.

Written Opinion of the International Searching Authority for Application No. PCT/US2021/044742, dated Jan. 4, 2022, 10 pages.

* cited by examiner

MEMORY DEVICES INCLUDING MULTIPLEXER DEVICES, AND RELATED ELECTRONIC SYSTEMS

CROSS-REFERENCE TO RELATED APPLICATION

This application is a continuation of U.S. patent application Ser. No. 17/006,364, filed Aug. 28, 2020, now U.S. Pat. No. 11,393,845, issued Jul. 19, 2022, the disclosure of which is hereby incorporated herein in its entirety by this reference.

TECHNICAL FIELD

The disclosure, in various embodiments, relates generally to the field of microelectronic device design and fabrication. More specifically, the disclosure relates to methods of forming microelectronic devices, and to related microelectronic devices, memory devices, and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified, easier and less expensive to fabricate designs.

One example of a microelectronic device is a memory device. Memory devices are generally provided as internal integrated circuits in computers or other electronic devices. There are many types of memory devices including, but not limited to, non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes strings of memory cells vertically extending through a stack structure including tiers of conductive structures and insulative materials. Each string of memory cells may include at least one select device coupled in series to a serial combination of vertically stacked memory cells. Such a configuration permits a greater number of switching devices (e.g., transistors) to be located in a unit of die area (e.g., length and width of active surface consumed) by building the array upwards (e.g., vertically) on a die, as compared to structures with conventional planar (e.g., two-dimensional (2D)) arrangements of transistors.

In a conventional non-volatile memory device (e.g., a conventional 3D NAND Flash memory device) including a vertical memory array, digit lines (e.g., bit lines, data lines) are coupled to the strings of memory cells of the vertical memory array, and openings are provided next to edges of the vertical memory array to accommodate digit line contacts for each of the digit lines. The digit line contacts electrically connect the digit lines to control logic circuitry to facilitate operations (e.g., read operations, program operations, erase operations) on the strings of memory cells of the vertical memory array. However, conventional configurations of digit lines and control logic circuitry can hamper improvements in the performance (e.g., data transfer rates, power consumption) of the non-volatile memory device, and/or can impede reductions to the sizes (e.g., horizontal footprints) of features of the non-volatile memory device.

DETAILED DESCRIPTION

Figure 1:
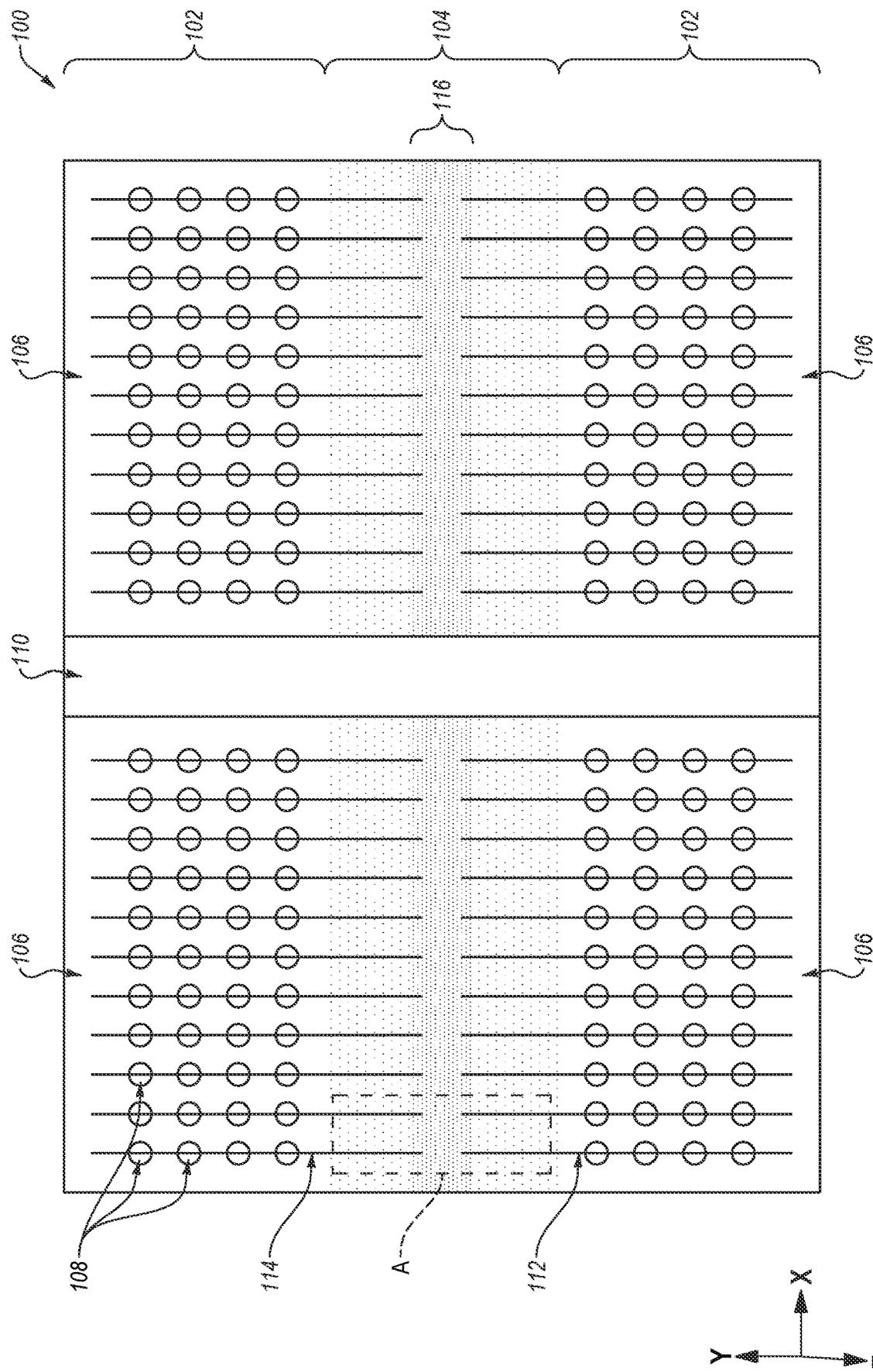
FIG. 1 is simplified partial plan view of a microelectronic device structure, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as DRAM device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory, such as conventional DRAM; conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide (MgO)), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xO_yH_z$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

FIG. 1 is a simplified partial plan view of a microelectronic device structure (e.g., a memory device structure, such as a 3D NAND Flash memory device structure) for a microelectronic device (e.g., a memory device, such as a 3D NAND Flash memory device), in accordance with embodiments of the disclosure. With the description provided below, it will be readily apparent to one of ordinary skill in the art that the structures and devices described herein may be included in relatively larger structures, devices, and systems.

As shown in FIG. 1, a microelectronic device structure 100 may include memory array regions 102, and a memory cache region 104 horizontally interposed in a Y-direction (e.g., a first horizontal direction) between the memory array regions 102. The memory array regions 102 may each include memory arrays 106 including strings of memory cells 108 extending in the Z-direction (e.g., a vertical direction). At least one contact region 110 may be horizontally interposed in the X-direction (e.g., a second horizontal direction) between horizontally neighboring memory arrays 106. In addition, the microelectronic device structure 100 further includes first digit lines 112 and second digit lines 114 coupled to the strings of memory cells 108 of the memory arrays 106. The first digit lines 112 may be substantially horizontally aligned with the second digit lines 114 in the X-direction, and may be horizontally offset (e.g., horizontally separated from) the second digit lines 114 in the Y-direction orthogonal to the X-direction. The first digit lines 112 and the second digit lines 114 each horizontally terminate within a digit line exit region 116 positioned within the memory cache region 104 of the microelectronic device structure 100. As described in further detail below, within a horizontal area of the digit line exit region 116, multiplexer (MUX) devices may be coupled to the first digit lines 112 and the second digit lines 114, and may also be coupled to page buffer devices located within a horizontal area of the memory cache region 104.

Still referring to FIG. 1, the memory arrays 106 within the memory array regions 102 of the microelectronic device structure 100 may include rows of the strings of memory cells 108 extending in the X-direction and columns of the strings of memory cells 108 extending in the Y-direction. The memory arrays 106 within the memory array regions 102 may individually include any desirable quantity of the strings of memory cells 108.

The strings of memory cells 108 may be located within a stack structure including a vertically alternating sequence of conductive structures and insulative structures arranged in tiers. The conductive structures of the stack structure may be employed as local access line (e.g., local word line) structures. Intersections between the conductive structures of the stack structure and cell pillar structures vertically extending through the stack structure may form memory cells of the strings of memory cells 108. The cell pillar structures may each individually be formed of and include a stack of materials. By way of non-limiting example, each of the cell pillar structures may be formed to include a charge-blocking material, such as first dielectric oxide material (e.g., $SiO_x$, such as $SiO_2$; $AlO_x$, such as $Al_2O_3$); a charge-trapping material, such as a dielectric nitride material (e.g., $SiN_y$, such as $Si_3N_4$); a tunnel dielectric material, such as a second oxide dielectric material (e.g., $SiO_x$, such as $SiO_2$); a channel material, such as a semiconductive material (e.g., silicon, such as polycrystalline Si); and a dielectric fill material (e.g., a dielectric oxide, a dielectric nitride, air). The charge-blocking material may be formed on or over surfaces of the conductive structures and the insulative structures of the tiers of stack structure at least partially defining horizontal boundaries of the cell pillar structures; the charge-trapping material may be horizontally surrounded by the charge-blocking material; the tunnel dielectric material may be horizontally surrounded by the charge-trapping material; the channel material may be horizontally surrounded by the tunnel dielectric material; and the dielectric fill material may be horizontally surrounded by the channel material. In some embodiments, the memory cells 108 comprise so-called "MONOS" (metal-oxide-nitride-oxide-semiconductor) memory cells. In additional embodiments, the memory cells 108 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 108 comprise so-called "floating gate" memory cells including floating gates (e.g., metallic floating gates) as charge storage structures.

Still referring to FIG. 1, within a horizontal area of the contact region 110, the microelectronic device structure 100 may include string driver circuitry (e.g., access line driver circuitry, word line driver circuitry) operatively associated with the memory arrays 106. The string driver circuitry, for example, may be located within a control logic region of a base structure vertically underlying the stack structure including the strings of memory cells 108 therein. The string driver circuitry includes string driver transistors (e.g., pass transistors, access transistors). The string driver transistors may be coupled (e.g., by way of conductive routing structures) to the conductive structures (e.g., local access line structure) of the stack structure including the strings of memory cells 108 therein, and may also be coupled to global access lines (e.g., global word lines) and select lines (e.g., block select lines).

As described in further detail below reference to FIG. 2 and FIG. 3, within a horizontal area of the memory cache region 104 the microelectronic device structure 100 includes page buffer circuitry, as well as MUX circuitry coupling the page buffer circuitry to the first digit lines 112 and the second digit lines 114. The MUX circuitry may be at least partially (e.g., substantially) confined within a horizontal area of the digit line exit region 116 within the memory cache region 104. In some embodiments, horizontal centerlines in the Y-direction of the memory cache region 104 and the digit line exit region 116 are substantially centered in the Y-direction between memory arrays 106 horizontally neighboring one another in the Y-direction. In additional embodiments, a horizontal centerline in the Y-direction of the memory cache region 104 and/or a horizontal centerline in the Y-direction of the digit line exit region 116 is offset in the Y-direction from a substantially central position between memory arrays 106 horizontally neighboring one another in the Y-direction. For example, the horizontal centerline of the memory cache region 104 and/or the horizontal centerline of the digit line exit region 116 may be relatively closer to one of two horizontally neighboring memory arrays 106 than the other of the two horizontally neighboring memory arrays 106.

Still referring to FIG. 1, the first digit lines 112 may exhibit horizontally elongate shapes extending in parallel in the Y-direction and separated from one another in the X-direction. As used herein, the term "parallel" means substantially parallel. In addition, the second digit lines 114 may also exhibit horizontally elongate shapes extending in parallel in the Y-direction and separated from one another in the X-direction. The first digit lines 112 and the second digit lines 114 may be located at substantially the same vertical position in the Z-direction within the microelectronic device structure 100 as one another. The first digit lines 112 may be discontinuous with the second digit lines 114, and may be coupled to different strings of memory cells 108 than the second digit lines 114. As shown in FIG. 1, the first digit lines 112 may be positioned within different memory array regions 102 of the microelectronic device structure 100 (and, hence, may horizontally extend over different memory arrays 106) than the second digit lines 114; and the first digit lines 112 and the second digit lines 114 may each horizontally extend into and terminate within the memory cache region 104 of the microelectronic device structure 100.

The first digit lines 112 may have substantially the same dimensions (e.g., length in the Y-direction, width in the X-direction, height in the Z-direction), shape, and spacing as the second digit lines 114; or the first digit lines 112 may have one or more of different dimension(s) (e.g., different length in a Y-direction, different width in the X-direction, different height in the Z-direction), different shape, and different spacing than the second digit lines 114. As shown in FIG. 1, in some embodiments, lengths of the first digit lines 112 in the Y-direction are substantially equal to (e.g., substantially the same as) lengths of the second digit lines 114 in the Y-direction. In additional embodiments, the lengths of the first digit lines 112 in the Y-direction are different than (e.g., less than, greater than) the lengths of the second digit lines 114 in the Y-direction.

Figure 2:
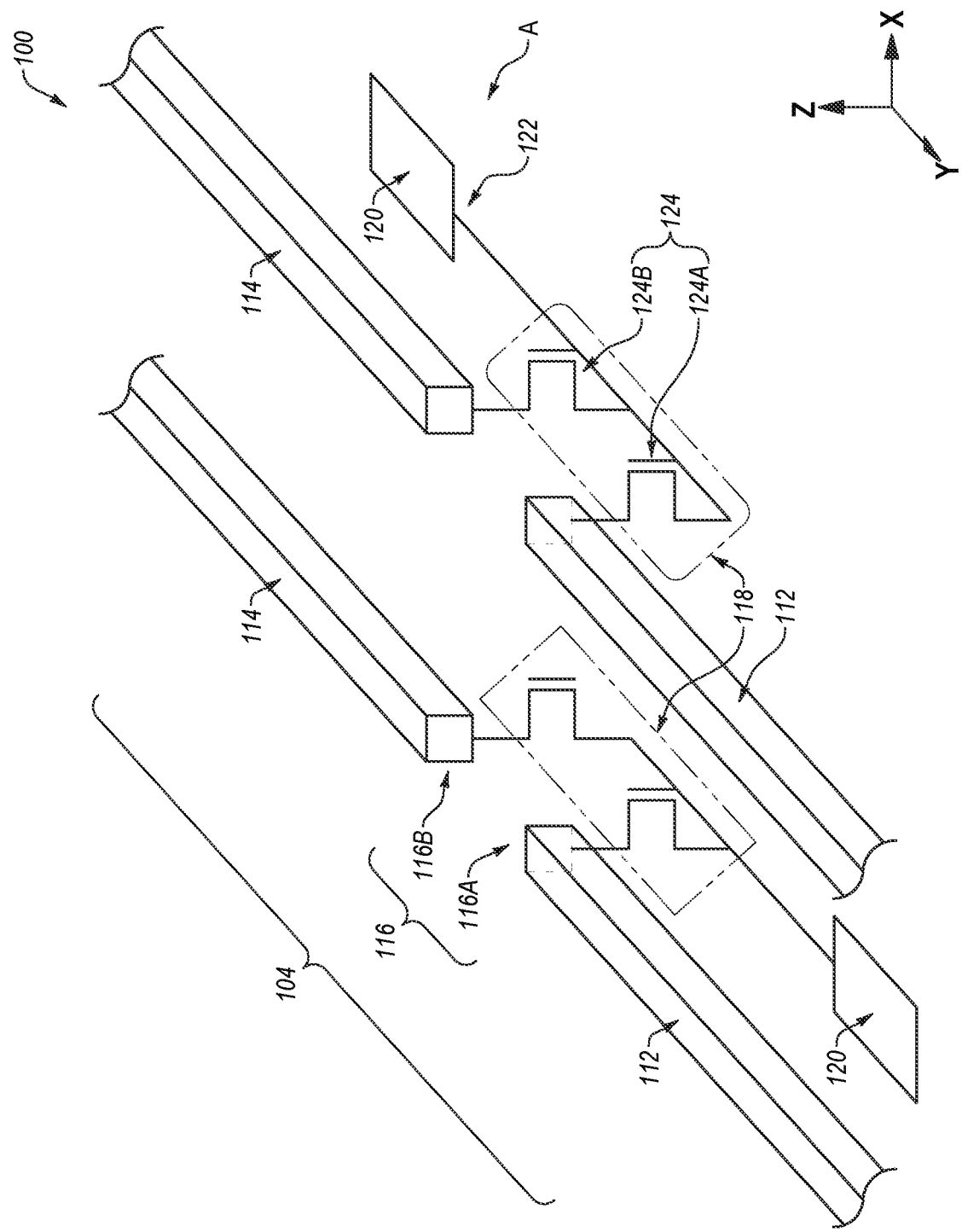
FIG. 2 is simplified perspective view of a section of the microelectronic device structure shown in FIG. 1, in accordance with embodiments of the disclosure.

FIG. 2 is simplified perspective view of a section A (depicted by way of dashed lines in FIG. 1) of the microelectronic device structure 100 shown in FIG. 1, in accordance with embodiments of the disclosure. As shown in FIG. 2, within the memory cache region 104 the microelectronic device structure 100 may include MUX devices 118 coupled to the first digit lines 112 and the second digit lines 114, and page buffer devices 120 coupled to the MUX devices 118 by way of conductive routing structures 122. Each of the MUX devices 118 may individually include a pair of transistors 124, including a first transistor 124A coupled to one of the first digit lines 112, and a second transistor 124B coupled to one of the second digit lines 114.

The MUX devices 118 may be configured and operated to selectively forward signals from the first digit lines 112 and the second digit lines 114 to the page buffer devices 120, and vice versa. For an individual MUX device 118, an active state (e.g., an ON state, a selected state) of the first transistor 124A thereof concurrent with an inactive state (e.g., on OFF state, a deselected state) of the second transistor 124B thereof may facilitate forwarding a signal from one of the first digit lines 112 coupled to the first transistor 124A to one of the page buffer devices 120 coupled to the MUX device 118, while precluding forwarding a signal from one of the second digit lines 114 coupled to the second transistor 124B to the page buffer device 120.

In some embodiments, the transistors 124 (including the first transistors 124A and the second transistors 124B thereof) of the MUX devices 118 comprise high-voltage-isolation (HVISO) transistors configured and operated to isolate relatively higher voltages employed in the memory array regions 102 (FIG. 1) and/or the memory cache region 104 from other features (e.g., structures, materials, devices) of the microelectronic device structure 100. For example, the transistors 124 of the MUX devices 118 may be configured to substantially block applied voltages greater than or equal to about 18 Volts (V) (e.g., within a range of from about 18V to about 25V) while in an inactive state (e.g., an OFF state, a deselected state). As shown in FIG. 2, in embodiments wherein the transistors 124 of the MUX devices 118 comprise HVISO transistors, the digit line exit region 116 may be divided into a first HVISO region 116A and a second HVISO region 116B. The first HVISO region 116A may include the first transistors 124A of the MUX devices 118 and additional HVISO circuitry for isolating the relatively higher voltages employed in memory array regions 102 (FIG. 1) and/or in portions of the memory cache region 104 operatively associated with the first digit lines 112. The second HVISO region 116B may include the second transistors 124B of the MUX devices 118 and further HVISO circuitry for isolating the relatively higher voltages employed in additional memory array regions 102 (FIG. 1) and/or in additional portions of the memory cache region 104 operatively associated with the second digit lines 114.

Still referring to FIG. 2, the page buffer devices 120 may be configured to receive data from memory cells of the strings of memory cells 108 (FIG. 1) of the memory arrays 106 (FIG. 1) within the memory array regions 102 (FIG. 1) and store the data (e.g., temporarily store the data) during various read and write operations. Each page buffer device 120 may individually be in electrical communication with an individual first digit line 112 and an individual second digit line 114 by way of an individual MUX device 118 coupled thereto through one or more of the conductive routing structures 122. The page buffer devices 120 may also be coupled to input/output (I/O) devices and additional data paths, and may facilitate or promote desirable transfer of data between the I/O devices and the strings of memory cells 108 (FIG. 1) of the memory arrays 106 (FIG. 1). In some embodiments, the page buffer devices 120 each individually comprise the same size (capacity) as that of a memory page in which data read from the memory cells of the memory page are temporarily stored before being serially output (e.g., to one or more I/O devices). In addition, the page buffer devices 120 may be configured to store information that is to be written to memory page of the memory cells of the memory arrays 106 (FIG. 1). Accordingly, the page buffer devices 120 may include a relatively large number of volatile storage elements, typically bistable elements or latches, in a number corresponding to the number of memory cells of the memory page. Each page buffer device 120 may, for example, include page buffer circuitry comprising an arrangement of dynamic data cache (DDC) memory, primary data cache (PDC), secondary data cache (SDC), temporary data cache (TDC), and digit line precharge circuitry.

Referring collectively to FIG. 1 and FIG. 2, the configuration of the microelectronic device structure 100 facilitates enhanced microelectronic device (e.g., memory device) performance relative to conventional configurations. For example, the relatively shorter lengths in the Y-direction of the first digit lines 112 and the second digit lines 114 as compared to conventional digit line lengths (e.g., individual digit line lengths greater than or equal to combined lengths of an individual first digit line 112 and an individual second digit line 114) may facilitate relatively faster data transfer rates. Data may be received from the first digit lines 112 and the second digit line 114 relatively faster during read operations, and data may be programmed to predetermined memory cells through the first digit lines 112 and the second digit lines 114 relatively faster during program operations. The configuration of the microelectronic device structure 100 may also facilitate reduced power consumption as compared to conventional configurations.

In additional embodiments, the microelectronic device structure 100 may be formed to have a different configuration than that previously described with reference to FIG. 1 and FIG. 2. The microelectronic device structure 100 may, for example, be formed to have different configuration(s) of one or more features (e.g., structures, devices) within the memory cache region 104 thereof than the configurations previously described with reference to FIG. 2. By way of non-limiting example, FIG. 3 is simplified perspective view of the section A (depicted by way of dashed lines in FIG. 1) of the microelectronic device structure 100 shown in FIG. 1, in accordance with additional embodiments of the disclosure.

The configuration of the memory cache region 104 shown in FIG. 3 may be similar to the configuration previously described with reference to FIG. 2, except that the transistors 124 (including the first transistors 124A and the second transistors 124B) of the MUX devices 118 may comprise low-voltage (LV) transistors, such as transistors configured to substantially block applied voltages less than about 18 V while in an inactive state (e.g., an OFF state, a deselected state). As shown in FIG. 3, in such embodiments, additional transistors 126 (e.g., HVISO transistors) configured and operated to isolate relatively higher voltages employed in the memory array regions 102 (FIG. 1) and/or the memory cache region 104 from other features (e.g., structures, devices) of the microelectronic device structure 100 are interposed between the MUX devices 118 and the page buffer devices 120 at desirable locations along the paths of the conductive routing structures 122. The additional transistors 126 may be configured to substantially block applied voltages greater than or equal to about 18V (e.g., within a range of from about 18V to about 25V) while in an inactive state (e.g., an OFF state, a deselected state).

Configuring the transistors 124 of the MUX devices 118 as LV transistors may reduce the horizontal area of the transistors 124 within the digit line exit region 116 as compared to configuring the transistors 124 as HVISO transistors. By way of non-limiting example, LV transistors may at least employ relatively thinner gate dielectric (e.g., gate oxide) thicknesses as compared to HVISO transistors. Accordingly, configuring the transistors 124 as LV transistors may reduce congestion within the digit line exit region 116 and/or effectuate increased horizontal space within the digit line exit region 116 for additional features of the microelectronic device structure 100 without having to increase the horizontal dimensions of the digit line exit region 116. As shown in FIG. 3, the additional transistors 126 (e.g., HVISO transistors) may be located at least partially (e.g., substantially) outside of the horizontal area of the digit line exit region 116. In some embodiments, the additional transistors 126 are positioned outside of the horizontal area of the digit line exit region 116 but within the horizontal area of the memory cache region 104.

Figure 3:
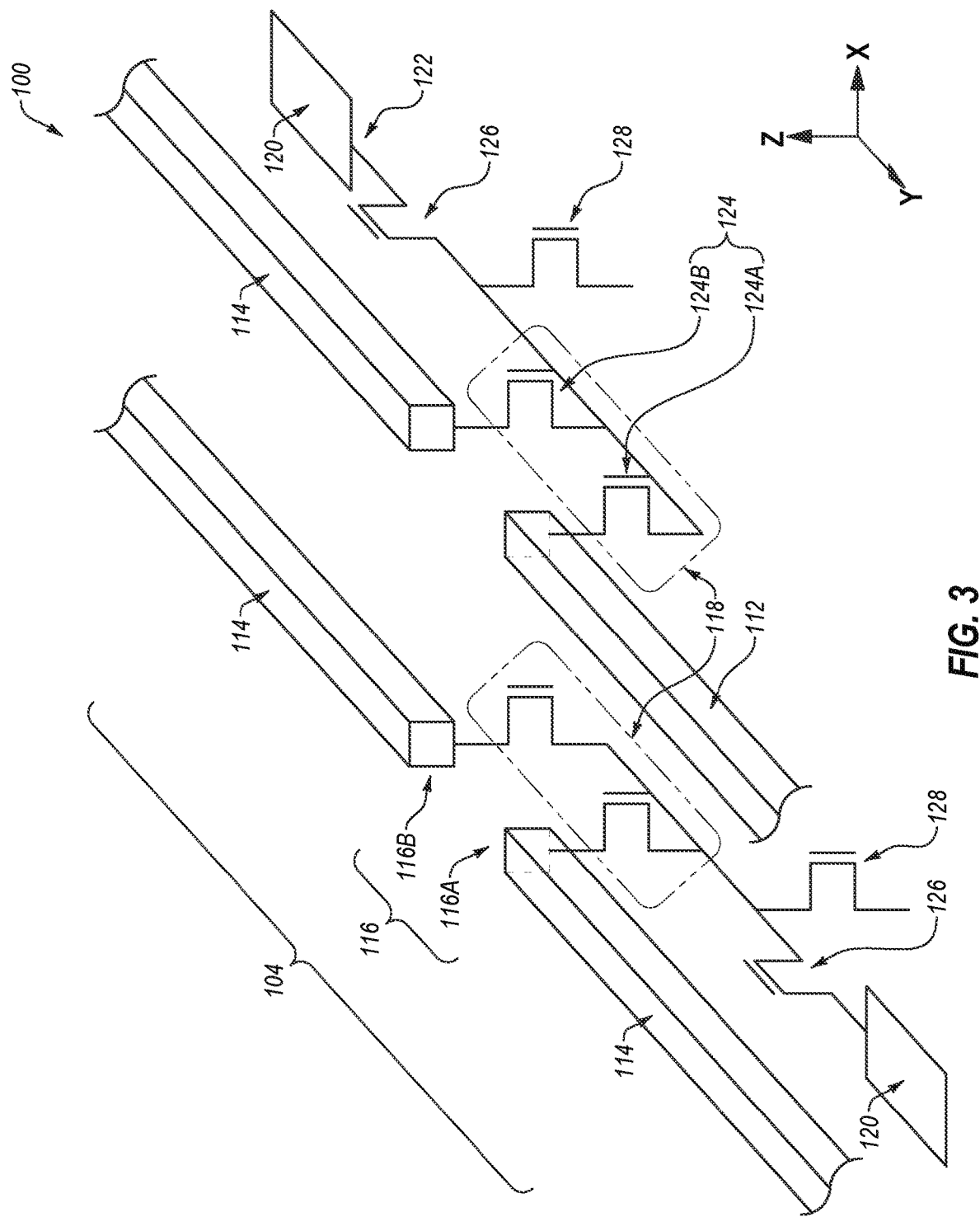
FIG. 3 is simplified perspective view of a section of the microelectronic device structure shown in FIG. 1, in accordance with additional embodiments of the disclosure.

Still referring to FIG. 3, within the memory cache region 104, the microelectronic device structure 100 may include further transistors 128 interposed between the transistors 124 (e.g., LV transistors) of the MUX devices 118 and the additional transistors 126 (e.g., HVISO transistors). The further transistors 128 may, for example, be employed for erase operations on memory cells of the strings of memory cells 108 (FIG. 1) of the memory arrays 106 (FIG. 1). By way of non-limiting example, during erase operations, one or more of the first digit lines 112 and/or one or more of the second digit lines 114 coupled to predetermined strings of memory cells 108 (FIG. 1) may be biased with a relatively high voltage (e.g., a voltage greater than or equal to about 18 V) through activation (e.g., an ON state, a selected state) of at least one of the further transistors 128 and at least one of the transistors 124 of one or more the MUX devices 118 in electrical communication therewith, while the page buffer devices 120 are protected from the relatively high voltage by inactivation (e.g., an OFF state, a deselected state) of the additional transistors 126.

Figure 4:
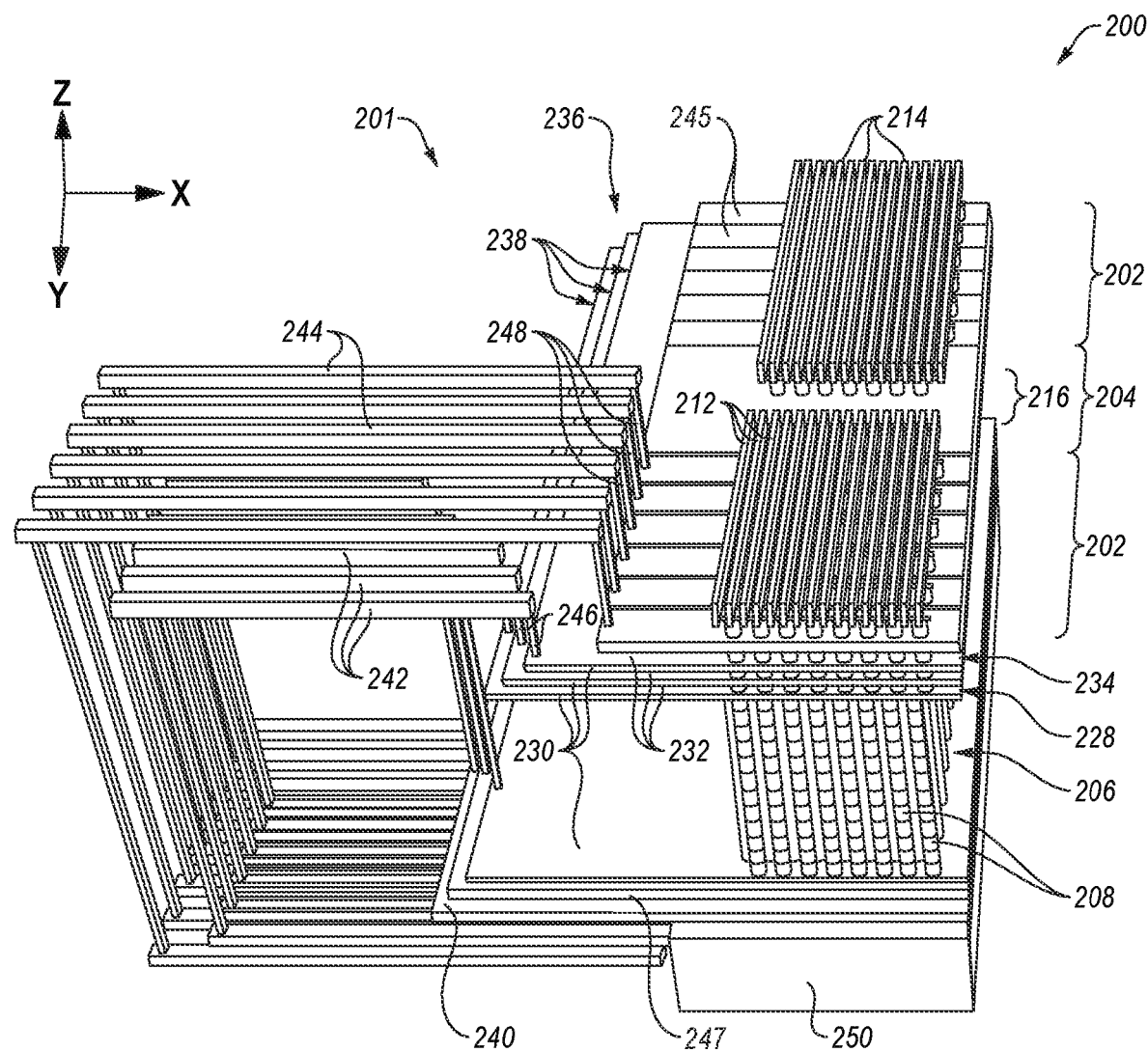
FIG. 4 is a simplified partial cutaway perspective view of a microelectronic device, in accordance with embodiments of the disclosure.

Microelectronic device structures (e.g., the microelectronic device structure 100) of the disclosure may be included in microelectronic devices of the disclosure. For example, FIG. 4 illustrates a partial cutaway perspective view of a portion of a microelectronic device 201 (e.g., a memory device, such as a 3D NAND Flash memory device) including a microelectronic device structure 200. The microelectronic device structure 200 may be substantially similar to the microelectronic device structure 100 previously described herein. In some embodiments, the microelectronic device structure 200 has the configuration of the microelectronic device structure 100 previously described with reference to FIG. 1 and FIG. 2. In additional embodiments, the microelectronic device structure 200 has the configuration of the microelectronic device structure 100 previously described with reference to FIG. 1 and FIG. 3. To avoid repetition, not all features (e.g., structures, materials, regions, devices) shown in FIG. 4 are described in detail herein. Rather, unless described otherwise below, in FIG. 4, a feature designated by a reference numeral that is a 100 increment of the reference numeral of a feature previously described with reference to one or more of FIG. 1 through FIG. 3 will be understood to be substantially similar to the previously described feature. In addition, for clarity and ease of understanding the drawings and associated description, some features of the microelectronic device structure 100 previously described herein are not shown in FIG. 4. However, it will be understood that any features of the microelectronic device structure 100 previously with reference to FIG. 1 (and FIG. 2 or FIG. 3) may be included in the microelectronic device structure 200 of the microelectronic device 201 described herein with reference to FIG. 4.

As shown in FIG. 4, in addition to the features of the microelectronic device structure 200 previously described herein in relation to the microelectronic device structure 100, the microelectronic device 201 may further include a stack structure 228 including a vertically alternating (e.g., in the Z-direction) sequence of conductive structures 230 and insulative structures 232 arranged in tiers 234 each including one of the conductive structures 230 vertically adjacent one of the insulative structures 232. The strings of memory cells 208 of the memory arrays 206 within the memory array regions 202 of the microelectronic device 201 may vertically extend through the stack structure 228. The conductive structures 230 may serve as local access line structures (e.g., local word line structures) for the strings of memory cells 208. In addition, the microelectronic device 201 may also include one or more staircase structures 236 having steps 238 defined by edges (e.g., horizontal ends in the X-direction) of the tiers 234 of the stack structure 228. The steps 238 of the staircase structures 236 may serve as contact regions for the conductive structures 230 of the stack structure 228. The microelectronic device 201 further includes additional features (e.g., additional structures, additional devices), as described in further detail below.

The microelectronic device 201 may further include a source structure 240, access line routing structures 242, first select gates 245 (e.g., upper select gates, drain select gates (SGDs)), select line routing structures 244, second select gates 247 (e.g., lower select gates, source select gate (SGSs)), access line contact structures 246, and select line contact structures 248. The access line contact structures 246 and the select line contact structures 248 may electrically couple components to each other as shown (e.g., the select line routing structures 244 to the first select gates 245, the access line routing structures 242 to the conductive structures 230 of the tiers 234 of the stack structure 228).

The microelectronic device 201 may also include a base structure 250 positioned vertically below the strings of memory cells 208. The base structure 250 may include at least one control logic region including control logic devices configured to control various operations of other features (e.g., the strings of memory cells 208) of the microelectronic device 201. As a non-limiting example, the control logic region of the base structure 250 may include page buffer devices (e.g., the page buffer devices 120 previously described with reference to FIG. 2) within a horizontal area of the memory cache region 204 of the microelectronic device structure 200. The page buffer devices may be coupled to the first digit lines 212 and the second digit lines 214 by way of MUX devices (e.g., the MUX devices 118 previously described with reference to FIG. 2 or FIG. 3) positioned within a horizontal area of the digit line exit region 216 of the microelectronic device structure 200 in a manner substantially similar to that previously described with reference to FIG. 2 or FIG. 3. In addition, the control logic region of the base structure 250 may further include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control logic region of the base structure 250 may be coupled to the first digit lines 212, the second digit lines 214, the source structure 240, the access line routing structures 242, and the select line routing structures 244. In some embodiments, the control logic region of the base structure 250 includes CMOS (complementary metal-oxide-semiconductor) circuitry. In such embodiments, the control logic region of the base structure 250 may be characterized as having a "CMOS under Array" ("CuA") configuration.

Thus, in accordance with embodiments of the disclosure, a microelectronic device comprises first digit lines, second digit lines, and multiplexer devices. The first digit lines are coupled to strings of memory cells. The second digit lines are coupled to additional strings of memory cells. The second digit lines are offset from the first digit lines in a first horizontal direction and are substantially aligned with the first digit lines in a second horizontal direction orthogonal to the first horizontal direction. The multiplexer devices are horizontally interposed between the first digit lines and the second digit lines in the first horizontal direction. The multiplexer devices are in electrical communication with the first digit lines, the second digit lines, and page buffer devices.

Furthermore, in accordance with additional embodiments of the disclosure, a microelectronic device comprises a first memory array region, first digit lines, a second memory array region, second digit lines, and a memory cache region. The first memory array region comprises a first memory array including first vertically extending strings of memory cells. The first digit lines are coupled to the first vertically extending strings of memory cells of the first memory array. The second memory array region comprises a second memory array including second vertically extending strings of memory cells. The second digit lines are coupled to the second vertically extending strings of memory cells of the second memory array. The memory cache region is horizontally interposed between the memory array regions. The memory cache region comprises multiplexer devices coupled to the first digit lines and the second digit lines, and page buffer devices coupled to the multiplexer devices.

Moreover, in accordance with further embodiments of the disclosure, a memory device comprises a stack structure, a first memory array, a second memory array, first digit lines, second digit lines, multiplexer devices, and a base structure. The stack structure comprises a vertically alternating sequence of insulative structures and conductive structures arranged in tiers. The first memory array comprises first strings of memory cells vertically extending through the stack structure. The second memory array comprises second strings of memory cells vertically extending through the stack structure. The first digit lines are coupled to the first strings of memory cells of the first memory array. The second digit lines are coupled to the second strings of memory cells of the second memory array. The multiplexer devices are horizontally interposed between and coupled to the first digit lines and the second digit lines. The base structure vertically underlies the stack structure and comprises a control logic region including page buffer devices coupled to the multiplexer devices.

Figure 5:
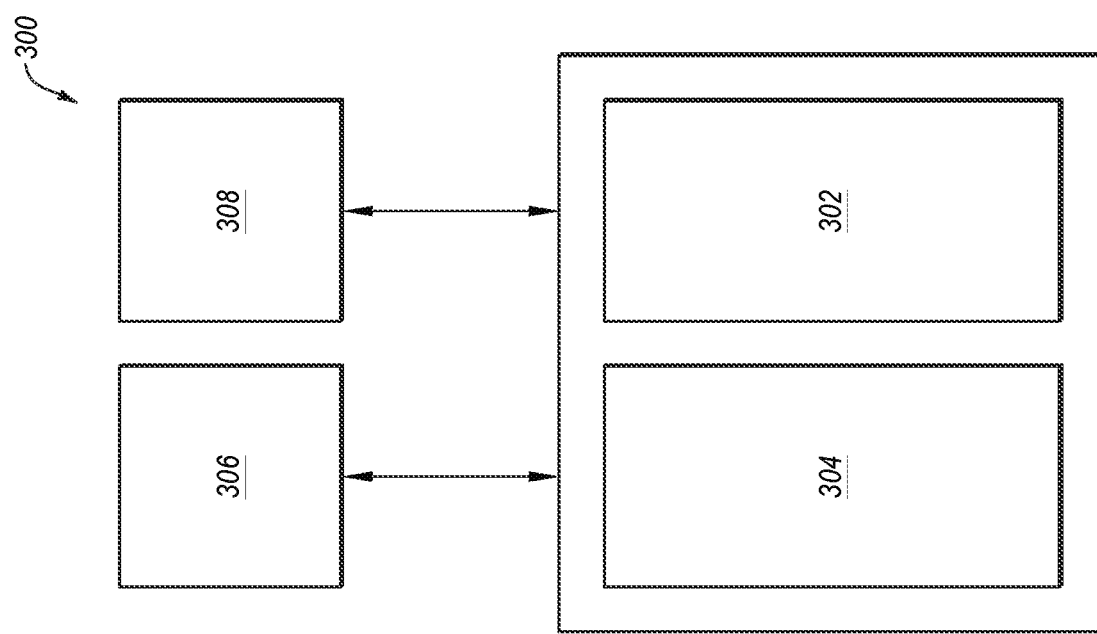
FIG. 5 is a schematic block diagram of an electronic system, in accordance with an embodiment of the disclosure.

Microelectronic devices structures (e.g., the microelectronic device structure 100) and microelectronic devices (e.g., the microelectronic device 201) in accordance with embodiments of the disclosure may be used in embodiments of electronic systems of the disclosure. For example, FIG. 5 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 300 includes at least one memory device 302. The memory device 302 may comprise, for example, one or more of a microelectronic device structure (e.g., the microelectronic device structure 100) and a microelectronic device (e.g., the microelectronic device 201) previously described herein. The electronic system 300 may further include at least one electronic signal processor device 304 (often referred to as a "microprocessor"). The electronic signal processor device 304 may, optionally, include one or more of a microelectronic device structure (e.g., the microelectronic device structure 100) and a microelectronic device (e.g., the microelectronic device 201) previously described herein. While the memory device 302 and the electronic signal processor device 304 are depicted as two (2) separate devices in FIG. 5, in additional embodiments, a single (e.g., only one) memory/processor device having the functionalities of the memory device 302 and the electronic signal processor device 304 is included in the electronic system 300. In such embodiments, the memory/processor device may include one or more of a microelectronic device structure (e.g., the microelectronic device structure 100) and a microelectronic device (e.g., the microelectronic device 201) previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 may comprise a single touchscreen device that can be used both to input information to the electronic system 300 and to output visual information to a user. The input device 306 and the output device 308 may communicate electrically with one or more of the memory device 302 and the electronic signal processor device 304.

Thus, in accordance with embodiments of the disclosure, an electronic system comprises an input device, an output device, a processor device operably connected to the input device and the output device, and a memory device operably connected to the processor device. The memory device comprises a stack structure, of memory cells, first digit lines, second digit lines, multiplexer devices, and a base structure. The stack structure comprises a vertically alternating sequence of conductive structures and insulative structures arranged in tiers. The stack structure includes a staircase structure having steps comprising edges of the tiers. The strings of memory cells vertically extend through the stack structure. The first digit lines vertically overlie the stack structure and are coupled to some of the strings of memory cells. The second digit lines vertically overlie the stack structure and are coupled to some other of the strings of memory cells. The multiplexer devices are horizontally interposed between and are coupled to the first digit lines and the second digit lines. The base structure vertically underlies the stack structure and comprises control logic circuitry including page buffer devices coupled to the multiplexer devices.

The structures and devices of the disclosure advantageously facilitate one or more of improved microelectronic device performance, reduced costs (e.g., manufacturing costs, material costs), increased miniaturization of components, and greater packaging density as compared to conventional structures, conventional devices, and conventional methods. The structures and devices of the disclosure may also improve scalability, efficiency, and simplicity as compared to conventional structures and conventional devices.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalent. For example, elements and features disclosed in relation to one embodiment may be combined with elements and features disclosed in relation to other embodiments of the disclosure.

What is claimed is:

1. A 3D NAND Flash memory device, comprising:
   a stack structure comprising tiers each comprising conductive material and insulative material vertically adjacent the conductive material;
   a memory array region comprising strings of memory cells vertically extending through the stack structure;
   an additional memory array region comprising additional strings of memory cells vertically extending through the stack structure;
   a digit line exit region horizontally interposed between the memory array region and the additional memory array region in a first direction, the digit line exit region including multiplexer devices within a horizontal area thereof;
   digit lines horizontally extending through the memory array region in the first direction and terminating within the digit line exit region, the digit lines coupled to the multiplexer devices and to groups of the strings of memory cells;
   additional digit lines horizontally extending through the additional memory array region and terminating within the digit line exit region, the additional digit lines coupled to the multiplexer devices and to groups of the additional strings of memory cells; and
   page buffer devices coupled to the multiplexer devices.

2. The 3D NAND Flash memory device of claim 1, wherein:
   the digit line exit region is confined within a horizontal area of a memory cache region horizontally interposed between the memory array region and the additional memory array region in the first direction; and
   the page buffer devices are positioned within the horizontal area of the memory cache region.

3. The 3D NAND Flash memory device of claim 1, further comprising a contact region horizontally neighboring the memory array region and the additional memory array region in a second direction orthogonal to the first direction, the contact region having string driver circuitry within a horizontal area thereof.

4. The 3D NAND Flash memory device of claim 1, wherein each of the multiplexer devices comprises:
a transistor coupled to one of the digit lines; and
an other transistor coupled to one of the additional digit lines.

5. The 3D NAND Flash memory device of claim 4, wherein the one of the digit lines is substantially horizontally aligned with the one of the additional digit lines in a second direction orthogonal to the first direction.

6. The 3D NAND Flash memory device of claim 4, wherein the transistor and the other transistor are each configured to substantially block applied voltages within a range of from about 18 Volts to about 25 Volts while in an OFF state.

7. The 3D NAND Flash memory device of claim 4, wherein the transistor and the other transistor are each configured to substantially block applied voltages less than about 18 Volts while in an OFF state.

8. The 3D NAND Flash memory device of claim 7, further comprising additional transistors interposed between and coupled to the page buffer devices and the multiplexer devices.

9. The 3D NAND Flash memory device of claim 8, wherein the additional transistors are each configured to substantially block applied voltages within a range of from about 18 Volts to about 25 Volts while in an OFF state.

10. The 3D NAND Flash memory device of claim 9, further comprising further transistors interposed between and coupled to the multiplexer devices and the additional transistors, the further transistors configured to facilitate erase operations on memory cells of the strings of memory cells of the memory array region and additional memory cells of the additional strings of memory cells of the additional memory array region.

11. A memory device, comprising:
a stack structure vertically overlying a base structure and comprising conductive material vertically alternating with insulative material;
memory arrays horizontally offset from one another in a first direction and individually comprising strings of memory cells vertically extending through the stack structure;
conductive lines vertically overlying the stack structure, the conductive lines horizontally overlapping and in electrical communication with columns of the strings of memory cells of one of the memory arrays;
additional conductive lines vertically overlying the stack structure and horizontally offset from the conductive lines in the first direction, the additional conductive lines horizontally overlapping and in electrical communication with columns of the strings of memory cells of an additional one of the memory arrays;
page buffer devices within the base structure and horizontally positioned between the one of the memory arrays and the additional one of the memory arrays in the first direction; and
multiplexer devices horizontally positioned between the one of the memory arrays and the additional one of the memory arrays in the first direction, each of the multiplexer devices in electrical communication with one of the conductive lines, one of the additional conductive lines, and one of the page buffer devices.

12. The memory device of claim 11, wherein:
the conductive lines are substantially horizontally aligned with the columns of the strings of memory cells of the one of the memory arrays in a second direction perpendicular to the first direction; and
the additional conductive lines substantially horizontally aligned in the second direction with the conductive lines and with the columns of the strings of memory cells of the additional one of the memory arrays.

13. The memory device of claim 11, wherein each of the multiplexer devices comprises:
a transistor in electrical communication with the one of the conductive lines; and
an additional transistor in electrical communication with the one of the additional conductive lines.

14. The memory device of claim 11, wherein each of the multiplexer devices comprises a pair of high-voltage-isolation (HVISO) transistors configured to substantially block applied voltages greater than or equal to about 18 Volts while in a deselected state.

15. The memory device of claim 11, wherein each of the multiplexer devices comprises a pair of low-voltage (LV) transistors configured to substantially block applied voltages less than about 18 Volts while in a deselected state.

16. The memory device of claim 15, further comprising high-voltage-isolation (HVISO) transistors electrically interposed between the page buffer devices and the multiplexer devices, the HVISO transistors configured to substantially block applied voltages greater than or equal to about 18 Volts while in a deselected state.

17. The memory device of claim 16, wherein further comprising additional transistors electrically interposed between the HVISO transistors and the multiplexer devices.

18. The memory device of claim 11, wherein:
the conductive lines terminate, in the first direction, between the one of the memory arrays and the additional one of the memory arrays at ends substantially aligned with one another in a second direction orthogonal to the first direction; and
the additional conductive lines terminate, in the first direction, between the one of the memory arrays and the additional one of the memory arrays at additional ends substantially aligned with one another in the second direction, the additional ends of the additional conductive lines horizontally separated from the ends of the conductive lines in the first direction.

19. An electronic system, comprising:
an input device;
an output device;
a processor device operably connected to the input device and the output device; and
a memory device operably connected to the processor device and comprising:
a stack structure comprising tiers each comprising conductive material and insulative material vertically adjacent the conductive material;
memory array regions horizontally neighboring one another in a first direction, each of the memory array regions comprising strings of memory cells vertically extending through the stack structure;
a digit line exit region horizontally intervening between the memory array regions in the first direction;
digit lines overlying the stack structure and coupled to the strings of memory cells of one of the memory array regions, the digit lines horizontally extending in the first direction through the one of the memory array regions and terminating within the digit line exit region;

additional digit lines overlying the stack structure and coupled to the strings of memory cells of an additional one of the memory array regions, the additional digit lines horizontally extending in the first direction through the additional one of the memory array regions and terminating within the digit line exit region;

multiplexer devices within a horizontal area of the digit line exit region, each of the multiplexer devices coupled to one of the digit lines and one of the additional digit lines; and a base structure underlying the stack structure and comprising page buffer circuitry coupled to the multiplexer devices.

20. The electronic system of claim 19, wherein the memory device comprises a 3D NAND Flash memory device.

\* \* \* \* \*

UNITED STATES PATENT AND TRADEMARK OFFICE
CERTIFICATE OF CORRECTION

| | |
|---|---|
| PATENT NO. | : 11,778,827 B2 |
| APPLICATION NO. | : 17/811037 |
| DATED | : October 3, 2023 |
| INVENTOR(S) | : Koichi Kawai et al. |

It is certified that error appears in the above-identified patent and that said Letters Patent is hereby corrected as shown below:

In the Specification

| | | |
|---|---|---|
| Column 4, | Line 65, | change "oxide (MgO))," to --oxide ($MgO_x$)),-- |
| Column 6, | Line 50, | change "(metal-oxide-nitride-oxide-semiconductor)" to --(metal - oxide - nitride - oxide - semiconductor)-- |
| Column 6, | Line 52-53, | change "(tantalum nitride-aluminum oxide-nitride-oxide-semiconductor)" to --(tantalum nitride - aluminum oxide - nitride - oxide - semiconductor)-- |

Signed and Sealed this
Fifth Day of December, 2023

Katherine Kelly Vidal
*Director of the United States Patent and Trademark Office*